United States Patent [19]

Aruga et al.

[11] Patent Number: 5,560,586
[45] Date of Patent: Oct. 1, 1996

[54] MAIN VALVE

[75] Inventors: Yoshiki Aruga, Tama; Naoyuki Suzuki, Fussa, both of Japan

[73] Assignee: Anelva Corporation, Japan

[21] Appl. No.: 442,164

[22] Filed: May 16, 1995

[30] Foreign Application Priority Data

May 25, 1994 [JP] Japan .................... 6-111289

[51] Int. Cl.⁶ .................... F16K 1/16; F16K 31/02
[52] U.S. Cl. .................... 251/298; 251/266; 251/335.3; 251/129.11
[58] Field of Search .................... 251/129.03, 129.11, 251/335.3, 14, 129.01, 31, 318, 298, 266; 79/424.8 VA

[56] References Cited

U.S. PATENT DOCUMENTS

| | | | |
|---|---|---|---|
| 2,767,923 | 10/1956 | Matthews | 251/129.03 X |
| 3,774,462 | 11/1973 | Thompson | 79/429.8 V A |
| 4,993,474 | 1/1985 | Ohyama | 251/335.3 X |
| 5,226,632 | 7/1993 | Tepman et al. | 251/335.3 |
| 5,318,272 | 6/1994 | Smith | 251/129.11 X |
| 5,363,872 | 11/1994 | Lorimer | 137/1 |

FOREIGN PATENT DOCUMENTS

| | | | |
|---|---|---|---|
| 0030090 | 1/1956 | Germany | 251/129.11 |
| 0132856 | 10/1979 | Japan | 251/335 B |
| 0035188 | 2/1989 | Japan | 251/129.01 |

*Primary Examiner*—Hoang Nguyen
*Attorney, Agent, or Firm*—Edward D. Manzo; Mark J. Murphy

[57] ABSTRACT

A bridge-type main valve located at a connecting outlet between a vacuum chamber and a main vacuum pump, and having a rod of an electric cylinder driven by a stepper motor connected to a valve seat for opening and closing the connecting outlet so that the driving direction and a closing surface of the valve seat form a right angle. A piston may be attached to the rod, and a cylindrical housing fitted in the piston so that the piston and the cylindrical housing form a pressurized air pumping chamber for moving the rod and the valve seat in the outlet closing direction. The valve can achieve fine pressure adjustment without any variable orifice by stopping a valve seat at an arbitrary (not stepwise) position.

14 Claims, 4 Drawing Sheets

MAIN VALVE

BACKGROUND OF THE INVENTION

1. Field of the Invention

The present invention relates to a main valve mounted at an opening for connecting a vacuum chamber and a main vacuum pump, and more particularly, to a main valve capable of finely adjusting the conductance of exhaust of equipment used in manufacturing flat panel displays, recording media, and semiconductors (or integrated circuits).

2. Description of the Related Art

In a vacuum processing apparatus, such as a sputtering apparatus, a dry-etching apparatus or a plasma enhanced CVD apparatus, various kinds of gases (referred to hereinafter as "process gas"), such as for example argon gas for plasma discharge, are introduced into a vacuum chamber to give a surface treatment to a substrate. The pressure of the process gas in the vacuum chamber is controlled in order to properly treat the surface of the substrate. Controlling the pressure of the process gas is, as is well known, performed by (a) adjusting the flow rate of the introduced gas, (b) adjusting the conductance of a variable orifice (e.g., a conductance adjusting mechanism) located between a main valve of the vacuum chamber and a main vacuum pump, or (c) stepwise stopping between an opening position and a closing position a valve seat of the main valve through the use of an air cylinder.

FIG. 1 illustrates a conventional bridge-type main valve, which is widely used as a main valve, located at an outlet 5 to which a vacuum chamber 4 and a main vacuum pump 3 are connected. In the bridge-type main valve, as shown in FIG. 1, a valve seat 2 is connected to the top ends of the shafts 14 of two air cylinders 1a, 1b. The air cylinders are on opposite ends of the outlet 5 at the bottom wall of the vacuum chamber 4. The valve seat 2 moves upward and downward by shifting the shafts 14 of the air cylinders 1a, 1b in the vertical direction. The valve seat is set at an open position 7 during vacuum evacuation in the vacuum chamber 4 and at a closed position 6 when the vacuum evacuation is stopped. Referring to FIG. 1, a variable orifice 8 is interposed between the outlet 5 and the main vacuum pump 3. The exhaust conductance of the process gas is controlled by adjusting the degree of opening of the variable orifice 8. The pressure of the process gas in the vacuum chamber 4 may be adjusted by this control of the exhaust conductance.

If a variable orifice is not mounted on the main valve, the pressure in the vacuum chamber can be adjusted only by control of the flow rate. If the pressure in the vacuum chamber is lower than the desired pressure, the flow rate of the process gas has to exceed the pumping ability of the main vacuum pump. The desired pressure, however, sometimes cannot be obtained using flow rate control because of an insufficient flow rate of the process gas.

If the pressure is adjusted by the variable orifice 8, this problem can usually be solved. However, even if the variable orifice 8 is fully opened, the maximum pumping speed of the main vacuum pump 3 is sacrificed (i.e. lowered) by the inherent conductance of the variable orifice 8.

Further, the shafts 14 of the air cylinders 1a, 1b operate rapidly through the use of compressed air. Therefore, the valve seat 2 connected to the shafts 14 also moves rapidly from the open position 7 to the closed position 6. The rapid movement of the valve seat 2 makes it possible to easily achieve a speedy start and a quick stop of the evacuating operation. However, since the shafts 14 move by compressed air, the valve seat 2 can stop only at the open position 7 and the closed position 6.

FIG. 2 shows a main valve having a stepwise stop mechanism which allows the valve seat 2 to stop at the closed position 6, the open position 7, and a stepwise stop position 9. In the stepwise stop mechanism of FIG. 2, a plurality of spacers 40 are attached to the leading end of the shaft 14 projecting from each of air cylinders 1a, 1b. The movement of the valve seat 2 becomes stepwise by removing one or more spacers 40. The exhaust conductance can be adjusted by this stepwise stop of the valve seat 2.

However, since the stop position 9 of the valve seat 2 is adjusted stepwise by removing the spacers 40, the exhaust conductance cannot be finely controlled, and therefore, the pressure of process gas in a vacuum chamber also cannot be finely controlled. For example, in a reactive sputtering method, in which the composition ratio of a film varies with sensitivity to the flow rate ratio (partial pressure ratio) of a plurality of process gases, if the pressure in the vacuum chamber is controlled by this stepwise stop mechanism, a thin film having a desired composition ratio sometimes may not be obtained.

As described above, a conventional bridge-type main valve is disadvantageous in that the pumping speed is lowered if pressure is controlled by a variable orifice located between a main valve and a main vacuum pump. Further, fine adjustments to the exhaust conductance are difficult in a mechanism which stops a valve seat stepwise.

SUMMARY OF THE INVENTION

The present invention is intended to overcome these problems. An object of the present invention is to provide a bridge-type main valve capable of stopping a valve seat at an arbitrary position. The pressure of process gas in a vacuum chamber can then be finely adjusted without a variable orifice.

In an embodiment of the present invention, a main valve is located at a connecting opening between a vacuum chamber and a main vacuum pump. The main valve comprises a valve seat, which is larger than the opening, for opening and closing the opening, two electric cylinders connected to the valve seat and opposed to each other, and driving sources for driving the electric cylinders.

Each of the electric cylinders has a ball screw connected to the driving source, a nut linked with the ball screw, a piston attached to the nut, and a rod with the piston formed at the leading end thereof. The rod may pierce through a bellows and be connectable to the valve seat.

The electric cylinders further include a chamber formed by a cylindrical housing of the electric cylinder and the piston. The chamber has a port through which pressurized fluid may be injected to move the valve seat in the direction for closing the opening.

According to another embodiment of the present invention, the main valve has one end of the valve seat larger than the opening and connected to a wall of the vacuum chamber so that the valve seat can turn. A rod of an electric cylinder pierces through a bellows and is connected to the other end of the valve seat. The electric cylinder comprises a cylindrical housing having a ball screw connected to a driving source, a nut linked with the ball screw, a stopper for stopping the rotation of the nut, a piston attached to the nut, and a rod having the piston at the leading end thereof. The chamber formed by the cylindrical housing and the piston has a port through which pressurized fluid may be injected to move the valve seat in the direction for closing and opening.

In the main valve of the present invention, the valve seat may be stopped at an arbitrary position between an opening position where the outlet is fully open and a closed position where the outlet is completely closed. By adjusting the stop position of the valve seat, the conductance of the outlet is adjusted, and thereby, the pressure of process gas in the vacuum chamber is finely adjusted. When the valve seat is set at the (fully) open position, the main vacuum pump delivers maximum pumping speed. Therefore, it is possible to finely adjust the pressure without sacrificing the maximum pumping speed of the main vacuum pump. Furthermore, a desired vacuum state can be obtained when the vacuum processing condition depends on the flow rate of gas introduced into the vacuum chamber.

Further, pressurized fluid can be injected into the cylinder to speed up the piston connected to the valve seat, thereby speeding up the operation of the valve seat for closing the outlet. Therefore, it is possible to shut the outlet rapidly to cope with an emergency stop of the apparatus or a power failure.

BRIEF DESCRIPTION OF THE DRAWINGS

In describing the present invention, reference is made to accompanying drawings, wherein like reference numerals denote like parts, and wherein.

DETAILED DESCRIPTION OF THE PREFERRED EMBODIMENTS

Preferred embodiments of the present invention will now be described with reference to the attached drawings.

Figure 1:
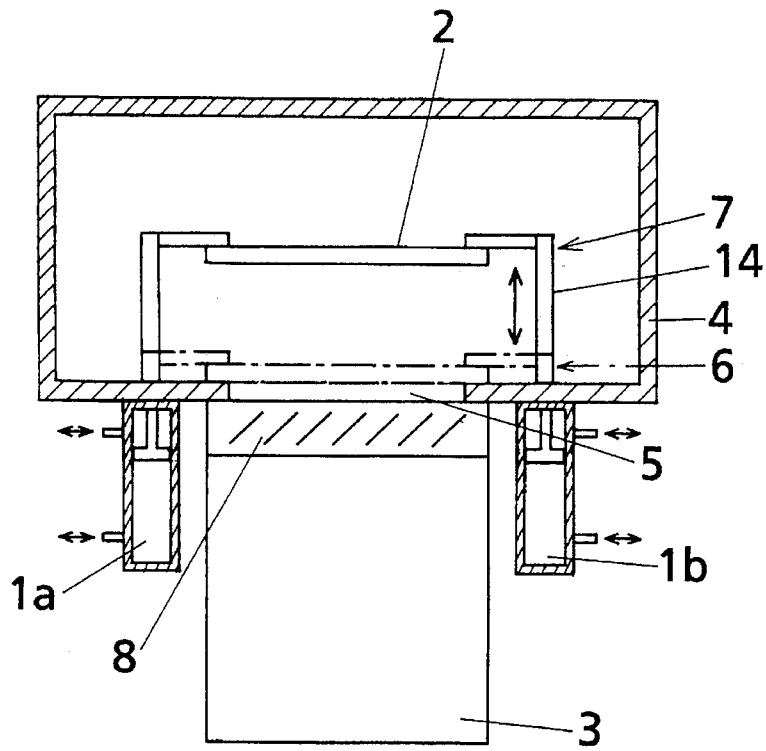
FIG. 1 is a sectional view of a conventional bridge-type main vane having a variable orifice.
Figure 2:
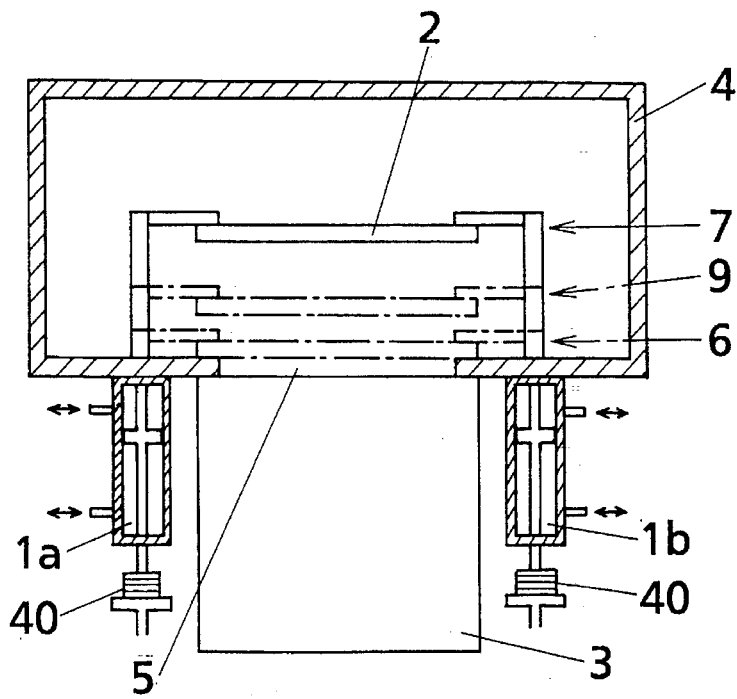
FIG. 2 is a sectional view of a conventional bridge-type main valve having a stepwise stop mechanism.
Figure 3:
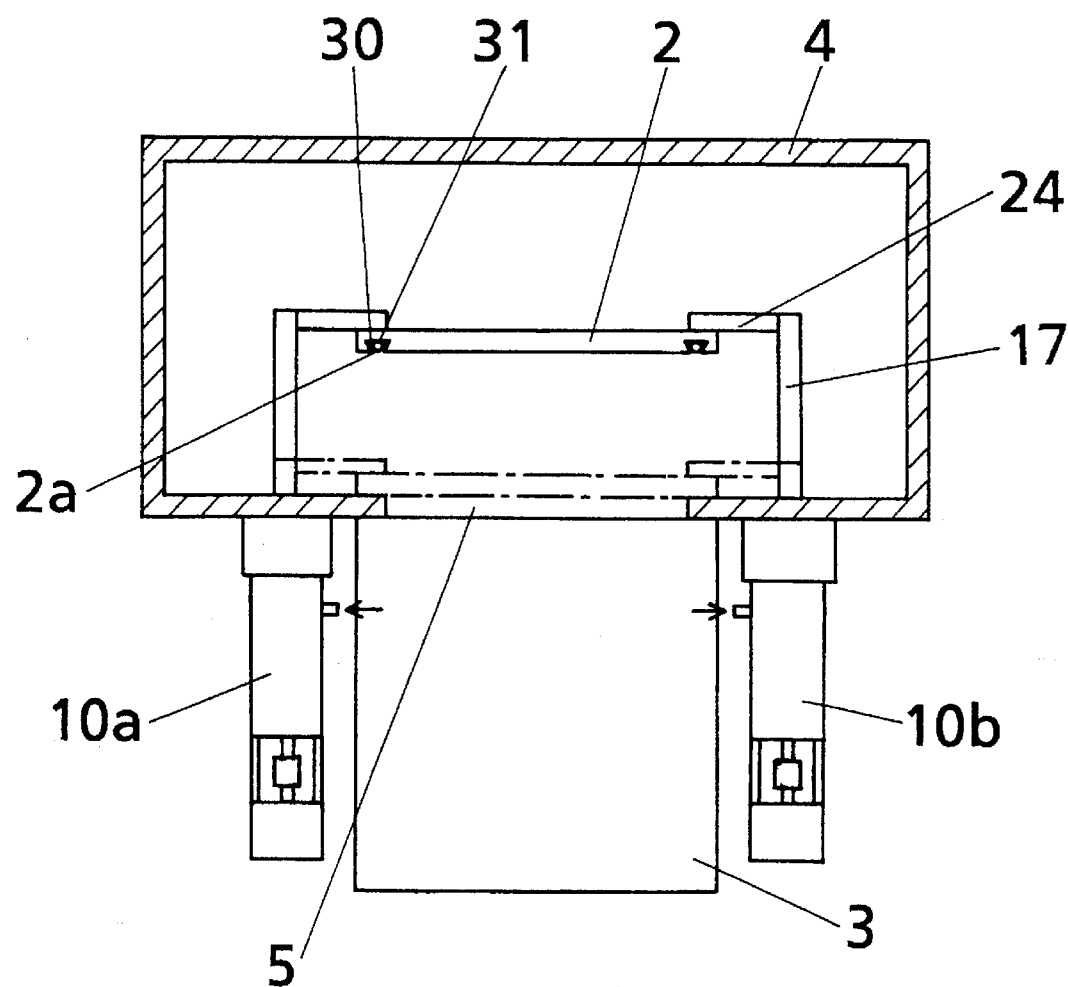
FIG. 3 is a sectional view of a preferred embodiment of the main valve of the present invention.
Figure 4:
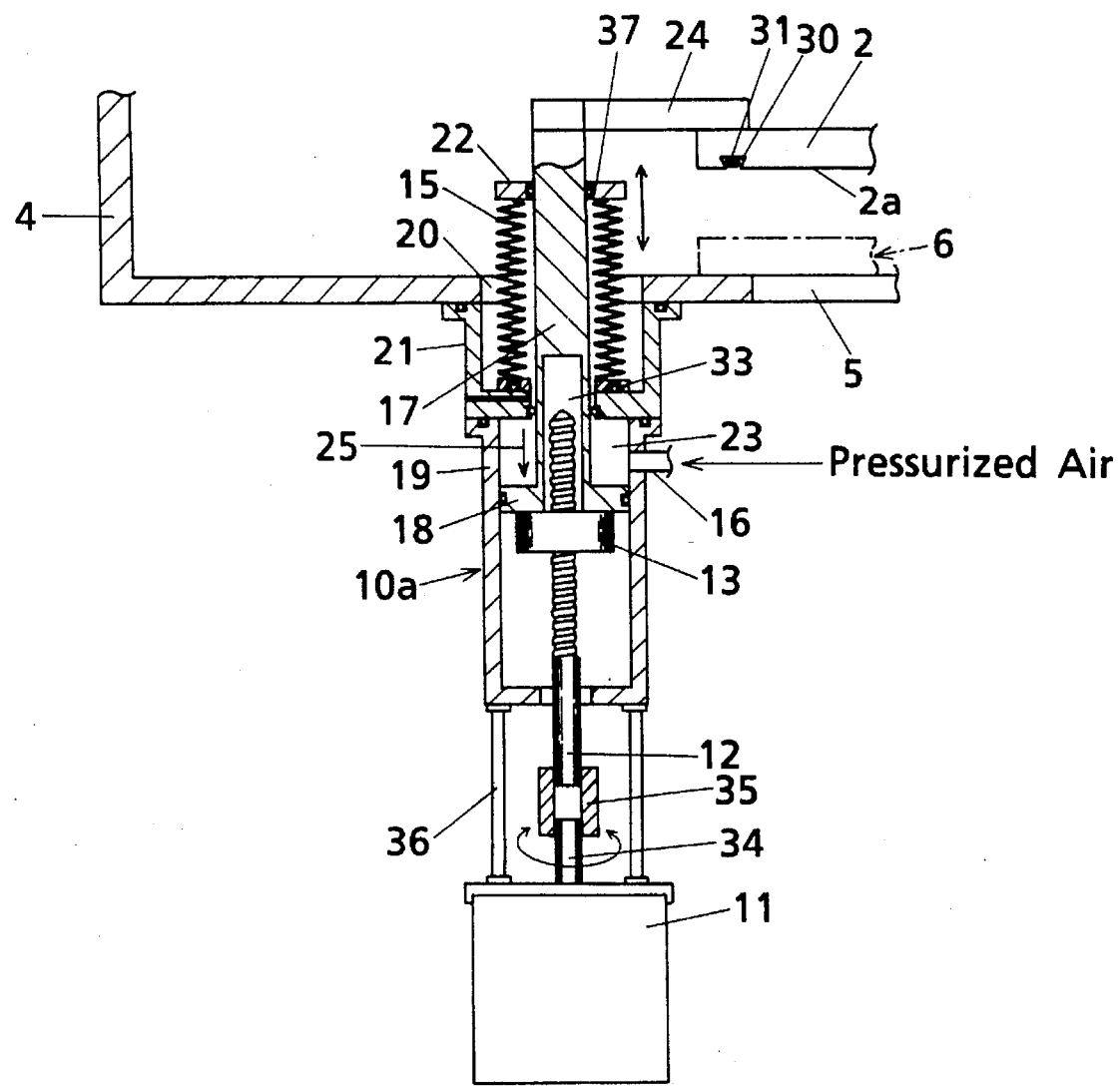
FIG. 4 is a detailed sectional view of an electric cylinder of the main valve of FIG. 3 of the present invention.

FIG. 3 is a sectional illustration or view of a bridge-type main valve according to a preferred embodiment of the present invention. In FIG. 3, a circular outlet 5 is formed at the bottom wall of a vacuum chamber 4 of a vacuum processing apparatus, and a main vacuum pump 3 is connected outside the outlet 5. Two electric cylinders 10a, 10b are located on opposite sides from one another around the outlet 5. A rod 17, which can move upward and downward, projects from each of the electric cylinders 10a, 10b into the vacuum chamber 4. The portion at the bottom wall of the vacuum chamber 4 through which each of the rods 17 projects is axially sealed by a bellows, as shown in FIG. 4. The axial seal isolates the inside of the vacuum chamber 4 from the atmospheric side, even if the rod 17 moves upward and downward. A disc-shaped valve seat 2, which is larger than the outlet 5, is attached to a pair of bars 24 which are attached to the top of the rods 17 of the electrical cylinders 10a, 10b. The lower surface 2a of the valve seat 2 has a pair of slots 30 in the portion corresponding to the peripheral edges of the outlet 5. An O-ring 31 is fitted into each slot 30. When the valve seat 2 covers the outlet 5, the O-rings 31 form a seal between the peripheral wall of the outlet 5 and the valve seat 2, and the inside of the vacuum chamber 4 can be kept air-tight.

FIG. 4 is a detailed perspective view of the electric cylinder 10a of FIG. 3. Only the electric cylinder 10a, which is the same as the electric cylinder 10b, is illustrated in FIG. 4. The electric cylinder 10a is a linear motion feedthrough. The shaft or rod 17 of the electric cylinder 10a moves linearly or in the upward and downward directions in a vacuum housing, and it can be stopped at an arbitrary position within the stroke thereof. Three or more electric cylinders may be located around the outlet 5. However, when two electric cylinders are used, as in the preferred embodiment in FIG. 3, it is possible to simplify the whole main valve and to easily synchronize the shafts of the electric cylinders.

Pistons 18, formed at the end of the rods 17, are housed in the cylindrical housings 19 of the electric cylinders 10a, 10b. A chamber 23 is formed by the cylindrical housing 19 and the piston 18. Each chamber 23 has a port 16 for injecting pressurized air therethrough. A nut 13 is attached to the lower surface of the piston 18 and is linked with a threaded portion of a ball screw 12. A part of the ball screw 12 projecting through the nut 13 pierces through the piston 18 and is housed in a cavity 33 formed inside the rod 17. The lower end of the ball screw 12 projecting from the bottom of the cylindrical housing 19 is connected through a coupling 35 to a shaft 34 of a driving source 11, such as for example a stepper motor. The stepper motor 11 may be a "UPK-569" manufactured by Oriental Motor Corp. of Torrance, Calif. The motor 11 is fixed to the cylindrical housing 19 via props 36. Since the ball screw 12 is fixed to the shaft 34 of the stepper motor 11, the ball screw does not move forward or backward even if the shaft 34 rotates. The rotation of the shaft 34 of the stepper motor 11 merely rotates the ball screw 12. Parts for isolating the atmosphere from the vacuum are sealed by O-rings in portions where they are connected to each other.

The cylindrical housing 19 is mounted outside a hole 20 formed at the bottom of the vacuum chamber 4 and through a tubular housing 21. A bellows 15 for vacuum sealing is located in the tubular housing 21. The rod 17, projecting from the bottom of the tubular housing 21, pierces through a plate 22 mounted at the top of the bellows 15 and projects into the vacuum chamber 4. The space between the plate 22 and the rod 17 is sealed with an O-ring 37. A bar 24 is located perpendicular to the leading end of the projecting rod 17. The other end of the lower surface of the bar 24 is linked with the upper surface of the valve seat 2.

The upward and downward movement of the valve seat 2 in the main valve is performed by converting the rotary movement of the stepper motor 11 as a drive source into linear movement by the ball screw 12 and transmitting the linear movement to the rod 17. Specifically, when the shaft 34 of the stepper motor 11 is rotated, the ball screw 12 fixed to the shaft 34 is rotated. The nut 13 linked to the ball screw 12 is moved upward or downward by the rotation of the ball screw 12, and accordingly, the piston 18 linked with the nut 13 is moved upward or downward. In correlation to the reciprocating movement of the piston 18, the bellows 15 expands or contracts, and the rod 17 moves upward and downward. The upward and downward movement of the rod 17 moves the valve seat 2 connected thereto in the upward or downward direction. Since the rotation of the ball screw 12 can thus be finely controlled by the stepper motor 11, the valve seat 2 is allowed to stop at an arbitrary position within a stroke of the rod 17. The conductance of the outlet 5 is changed by changing the stop position of the valve seat 2.

Therefore, the pressure in the vacuum chamber 4 can be adjusted by finely changing the conductance of the outlet 5.

In order to rapidly close the outlet 5 by the main valve, the stepper motor 11 is switched off and pressurized air is injected into the chamber 23 through the port 16. The piston 18 receives pressure in the direction of arrow 25 by the injection of the pressurized air, and swiftly moves downward. Then, the rod 17 connected to the piston 18 and the valve seat 2 rapidly move downward, and the valve seat 2 rapidly closes the outlet 5. Further, when the piston 18 moves downward, the nut 13 also moves downward. The downward action of the nut 13 idles the ball screw 12 and the stepper motor 11.

Such a swirl downward movement of the valve seat 2 can prevent breakdown of the main pump 3 during an unpredictable accident. If, as a result of the unpredictable accident, the pressure in the vacuum chamber 4 rapidly becomes extraordinarily high, such as atmospheric pressure, then a high vacuum pump, such as a molecular turbopump or a cryopump, used as the main pump 3 breaks down easily because the high vacuum pump is exposed to the atmospheric pressure. Rapidly closing the outlet 5 with the valve seat 2 protects the high vacuum pump from exposure to atmospheric pressure.

Although in this embodiment a control circuit for rotating the stepper motor 11 in synchronization with the driving of the two electric cylinders 10a, 10b, a sensor for checking the position of the valve seat 2, and an encoder for detecting the rotation of the stepper motor 11 are not illustrated, they may be mounted to the valve.

Alternatively, when the two electric cylinders are driven, the rotary movement of the stepper motor 11 as a driving source of one of the electric cylinders may be transmitted to the ball screw of the other electric cylinder by a rotation transmitting mechanism like a timing belt.

Figure 5:
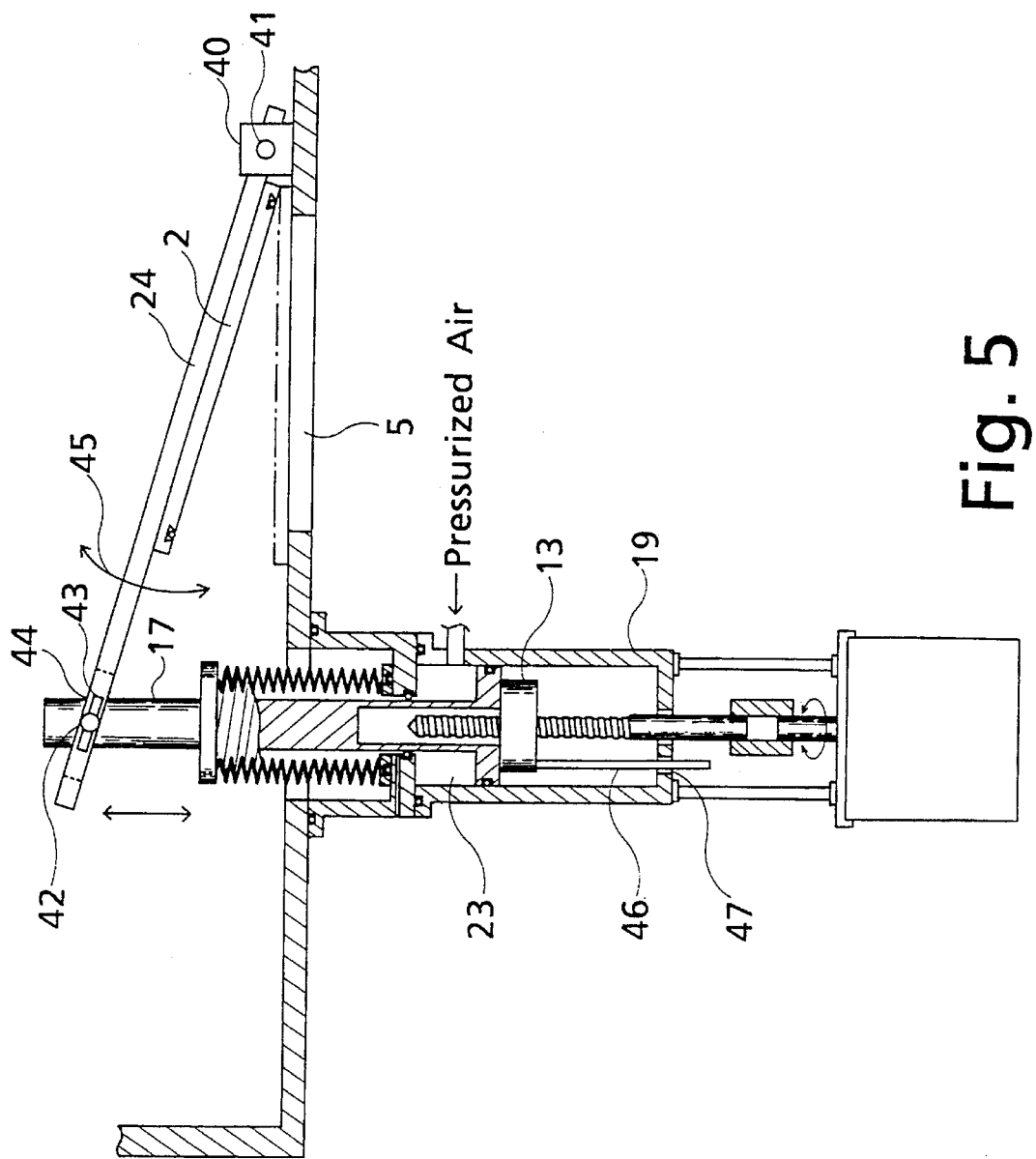
FIG. 5 is a sectional view of another embodiment of the main valve of the present invention.

FIG. 5 illustrates a main valve in which the valve seat is opened and closed by one electric cylinder. At one end of the bar 24 attached to the upper surface of the valve seat 2 is a hole in which the rod 17 is inserted. A pin 42 piercing through the rod 17 is fitted in slits 43 formed on both sides of the bar 24. The other end of the bar 24 is linked with a block 40 mounted near the outlet 5 by a pin 41, and thereby, the bar 24 pivots on the pin 41. When the rod 17 linked with one end of the bar 24 moves upward and downward, the valve seat 2 moves in the direction of arrow 45. This movement of the valve seat 2 adjusts the exhaust conductance of the outlet 5.

When the valve seat 2 is moved by one electric cylinder, the nut 13 or the rod 17 is provided with a whirl stopper so that the rotary movement of the ball screw 12 is transmitted to the nut 13 and the rod 17 as a linear movement with reliability. In this embodiment, a whirl or stick stopper 46 is attached to the nut 13, and is pierced through a hole 47 formed at the bottom of the cylindrical housing 19. Even if the nut 13 rotates, the stopper 46 abuts against the hole 47, thereby blocking the rotation of the nut 13.

In the bridge-type main valve in which two electric cylinders are mounted to the valve seat on opposite ends to each other, it is unnecessary to provide the nut 13 or the rod 17 with a whirl stopper for stopping the rotation of the nut 13 or the rod 17. This is because the rotation of the nut 13 (or the rod 17) of one of the electric cylinders is canceled out by that of the other electric cylinder.

Although, in the above embodiments the bellows 15 is used to isolate the vacuum chamber 4 from the atmospheric side, the rod 17 may be sealed by an O-ring. It is only necessary that the rotation angle for the stepper motor 11 can be controlled. A servomotor or an induction motor may be used in the main valve of the present invention. Pressurized oil may be injected into the chamber 23 of the cylindrical housing 19 instead of pressurized air.

As described above, according to the present invention it is possible to provide a main valve which can finely adjust the conductance without impairment of the maximum pumping speed of a main vacuum pump.

Further, according to the present invention it is possible to shut the outlet rapidly in the event of an unpredictable accident.

We claim:

1. A main valve located at an opening for connecting a vacuum chamber and a main vacuum pump, said main valve comprising:

a valve seat for opening and closing said opening, said valve seat being larger than said opening;

at least one cylinder connectable to said valve seat for raising and lowering said valve seat; and a driving source for driving said cylinder, said cylinder comprising a cylindrical housing, a rod having one end extending through s aid cylindrical housing and being connectable to said valve seat and at another end a piston housed in said cylindrical housing, a nut coupled to said piston, a ball screw having a threaded portion coupled within said nut and a lower portion connectable to said driving source for rotating said ball screw which drives said nut, said piston, said rod, and said valve seat forward and backward to open and close said opening, wherein said rod has a cavity therein and a part of said threaded portion of said ball screw projects through said nut and said piston and is housed in said cavity in said rod.

2. A main valve located at an opening for connecting a vacuum chamber and a main vacuum pump, said main valve comprising:

a valve seat for opening and closing said opening, said valve seat being larger than said opening;

at least one cylinder connectable to said valve seat for raising and lowering said valve seat; and a driving source for driving said cylinder, said cylinder comprising a cylindrical housing, a rod having one end extending through said cylindrical housing and being connectable to said valve seat and at another end a piston housed in said cylindrical housing, a nut coupled to said piston, a ball screw having a threaded portion coupled within Said nut and a lower portion connectable to said driving source for rotating said ball screw which drives said nut, said piston, said rod, and said valve seat forward and backward to open and close said opening, wherein said cylinder is connectable to one end of said valve seat and another end of said valve seat is connectable to an edge of said opening.

3. The main valve of claim 2 wherein a bar is connected to said one end of said valve seat and said cylinder is connected to said bar via a pin inserted through the rod of said cylinder and said bar.

4. The main valve of claim 3 wherein said bar has a hole in which said rod is inserted.

5. The main valve of claim 3 wherein a second bar is connected to the other end of said valve seat and said second bar is connected to the edge of said opening via a block mounted on the edge and a pin through the block and the second bar, whereby said valve seat rotates open when the rod of said cylinder drives upward.

6. A main valve according to claim 1, wherein a chamber formed by said cylindrical housing and said piston of said cylinders includes a port through which pressurized fluid may be injected to move said valve seat for closing said opening.

7. The main valve of claim 1 wherein said at least one cylinder comprises two cylinders connectable to opposite ends of said valve seat.

8. The main valve of claim 1 wherein said valve seat has a lower surface, said lower surface comprising a pair of slots having O-rings therein to form a seal between said valve seat and the opening when said opening is closed.

9. The main valve of claim 1 wherein said rod is axially sealed by a bellows for vacuum sealing the vacuum chamber.

10. The main valve of claim 1 wherein said driving source is a motor.

11. The main valve of claim 1 wherein said cylinder is electric.

12. The main valve according to claim 1 wherein said cylinder further comprises a bellows operatively coupled to said piston on at least one side of said vacuum chamber.

13. The main valve of claim 1 wherein said cylinder further comprises a whirl stopper connected to said nut and said cylindrical housing to prevent rotation of the nut.

14. The main valve of claim 2 wherein said cylinder further comprises a whirl stopper connected to said nut and said cylindrical housing to prevent rotation of the nut.

* * * * *